(12) United States Patent
Chou et al.

(10) Patent No.: US 9,589,856 B2
(45) Date of Patent: Mar. 7, 2017

(54) AUTOMATICALLY ADJUSTING BAKING PROCESS FOR LOW-K DIELECTRIC MATERIAL

(71) Applicant: Taiwan Semiconductor Manufacturing Company, Ltd., Hsin-Chu (TW)

(72) Inventors: Chia-Cheng Chou, Hsin-Chu (TW); Chung-Chi Ko, Hsin-Chu (TW); Keng-Chu Lin, Ping-Tung (TW); Shwang-Ming Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/949,206

(22) Filed: Nov. 23, 2015

(65) Prior Publication Data

US 2016/0086865 A1    Mar. 24, 2016

Related U.S. Application Data

(62) Division of application No. 13/219,317, filed on Aug. 26, 2011, now Pat. No. 9,196,551.

(51) Int. Cl.
*H01L 21/00*    (2006.01)
*H01L 21/66*    (2006.01)
*H01L 21/3105*    (2006.01)
*H01L 21/768*    (2006.01)

(52) U.S. Cl.
CPC .......... *H01L 22/26* (2013.01); *H01L 21/3105* (2013.01); *H01L 21/31058* (2013.01); *H01L 21/76802* (2013.01); *H01L 21/76814* (2013.01); *H01L 21/76828* (2013.01); *H01L 21/76843* (2013.01); *H01L 21/76879* (2013.01); *H01L 21/76883* (2013.01); *H01L 22/12* (2013.01); *H01L 22/20* (2013.01)

(58) Field of Classification Search
None
See application file for complete search history.

(56) References Cited

U.S. PATENT DOCUMENTS

| | | | |
|---|---|---|---|
| 5,403,434 A | * | 4/1995 | Moslehi ............ H01L 21/02046 134/1 |
| 5,660,696 A | * | 8/1997 | Moon ................. C23C 14/0063 204/192.17 |
| 6,424,881 B1 | | 7/2002 | Steffan |
| 6,528,409 B1 | | 3/2003 | Lopatin |
| 7,176,039 B1 | | 2/2007 | Papasouliotis et al. |
| 2001/0019900 A1 | | 9/2001 | Hasegawa et al. |
| 2003/0220708 A1 | | 11/2003 | Sahin et al. |
| 2005/0054202 A1 | | 3/2005 | Pan et al. |
| 2006/0073697 A1 | | 4/2006 | Wang et al. |
| 2006/0205232 A1 | | 9/2006 | Li et al. |
| 2006/0276046 A1 | | 12/2006 | Hayashida et al. |
| 2007/0020952 A1 | | 1/2007 | Lin et al. |

(Continued)

*Primary Examiner* — Evren Seven
(74) *Attorney, Agent, or Firm* — Slater Matsil, LLP

(57) ABSTRACT

A method includes etching a low-k dielectric layer on a wafer to form an opening in the low-k dielectric layer. An amount of a detrimental substance in the wafer is measured to obtain a measurement result. Process conditions for baking the wafer are determined in response to the measurement result. The wafer is baked using the determined process conditions.

20 Claims, 5 Drawing Sheets

(56) References Cited

U.S. PATENT DOCUMENTS

| | | |
|---|---|---|
| 2007/0077781 A1 | 4/2007 | Lee et al. |
| 2007/0156213 A1* | 7/2007 | Friedensohn ............. A61F 7/03 607/114 |
| 2008/0199976 A1 | 8/2008 | Yamagata et al. |
| 2009/0017563 A1 | 1/2009 | Jiang et al. |
| 2009/0250826 A1 | 10/2009 | Inomata |
| 2009/0257270 A1 | 10/2009 | Schricker et al. |
| 2009/0311850 A1 | 12/2009 | Sanchez |
| 2010/0108982 A1 | 5/2010 | Ping et al. |
| 2010/0118294 A1 | 5/2010 | Han |
| 2011/0254126 A1 | 10/2011 | Kreupl et al. |
| 2011/0260290 A1 | 10/2011 | Kalra et al. |
| 2011/0278529 A1 | 11/2011 | Xu |
| 2012/0077339 A1 | 3/2012 | Ko et al. |

\* cited by examiner

AUTOMATICALLY ADJUSTING BAKING PROCESS FOR LOW-K DIELECTRIC MATERIAL

PRIORITY CLAIM AND CROSS-REFERENCE

This application is a divisional of U.S. patent application Ser. No. 13/219,317, entitled "Automatically Adjusting Baking Process for Low-k Dielectric Material," filed on Aug. 26, 2011, which application is incorporated herein by reference.

BACKGROUND

Integrated circuit devices such as transistors are formed over semiconductor wafers. The devices are interconnected through metal lines and vias to form functional circuits. The process for forming the metal lines and vias are referred to as back-end-of-line processes. To reduce the parasitic capacitance of the metal lines and vias, the metal lines and vias are formed in low-k dielectric layers, which are formed of low-k dielectric materials having k values lower than 3.8, lower than 3.0, or lower than 2.5.

In the formation of the metal lines and vias, the low-k dielectric layers need to be etched to form trenches and via openings, followed by filling a metallic material into the trenches and via openings. Since the low-k dielectric materials can easily absorb detrimental substances such as moisture, a baking process is typically performed before the filling of the metallic material. During the baking process, the detrimental substances are removed from the low-k dielectric material through evaporation.

Conventionally, fixed baking process was adopted. In the fixed baking process, baking process conditions such as the time, the power, and the temperature are pre-determined. The fixed baking process, however, may cause over-baking or under-baking. When over-baking occurs, extra thermal budget is unnecessarily introduced. Conversely, when under-baking occurs, there may be detrimental substances remaining in the low-k dielectric material. The situation is further worsened since the amount of the detrimental substances various. For example, for different etching processes, the amount of the detrimental substances may change from etching process to etching process. Even in the same etching process, the amount of the detrimental substances may also change from wafer to wafer. This makes it difficult for solving the over-baking and under-baking problems.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of baking dielectric layers that are formed on semiconductor wafers is provided in accordance with various embodiments. The intermediate stages of forming and patterning a dielectric layer and performing a baking process on the dielectric layer in accordance with an embodiment are illustrated. The variations of the embodiment are discussed. Throughout the various views and illustrative embodiments, like reference numbers are used to designate like elements.

Figure 1:
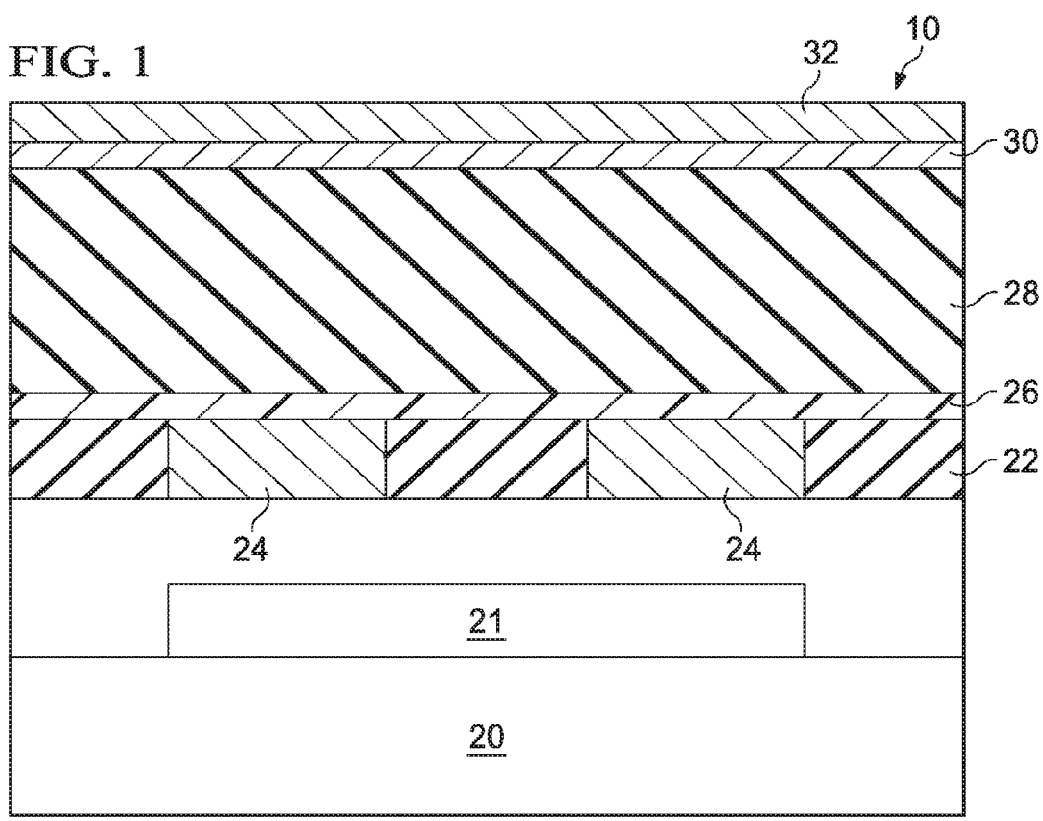
FIGS. 1, 2, 4, and 5 are cross-sectional views of intermediate stages in the manufacturing of metal lines and vias in a low-k dielectric layer in accordance with various embodiments.

Referring to FIG. 1, wafer 10, which includes substrate 20 and the overlying layers, is provided. Substrate 20 may be formed of a commonly used semiconductor material such as silicon, silicon germanium, or the like, and may be a bulk substrate or a semiconductor-on-insulator (SOI) substrate. Integrated circuit devices 21 such as transistors are formed at a surface of substrate 20. Dielectric layer 22 is formed over substrate 20. In an embodiment, dielectric layer 22 is a low-k dielectric layer, for example, having a k value lower than about 3.0. Metal features 24 are formed in dielectric layer 22. In some embodiments, metal features 24 are formed of copper or a copper alloy, although they may also comprise, or may be formed of, other conductive materials such as tungsten, aluminum, or the like.

Etch stop layer 26 and dielectric layer 28 are formed over dielectric layer 22. Etch stop layer 26 may be formed of silicon carbide, silicon nitride, or the like. Dielectric layer 28 may be formed of a low-k dielectric material that has a dielectric constant (k value) lower than about 3.0, or even lower than about 2.5, for example. Accordingly, dielectric layer 28 is referred to as a low-k dielectric layer throughout the description. Optionally, bottom anti-reflective coating (BARC) 30 may be formed over low-k dielectric layer 28. BARC 30 may be formed of a non-fluorine containing material such as silicon oxynitride. Metal hard mask 32 is formed over BARC 30. Metal hard mask 32 may comprise titanium, titanium nitride, tantalum, tantalum nitride, boron nitride, or the like. Metal hard mask 32 may also be a composite layer, which may comprise a tantalum layer and a tantalum nitride layer on the tantalum layer, for example.

Figure 2:
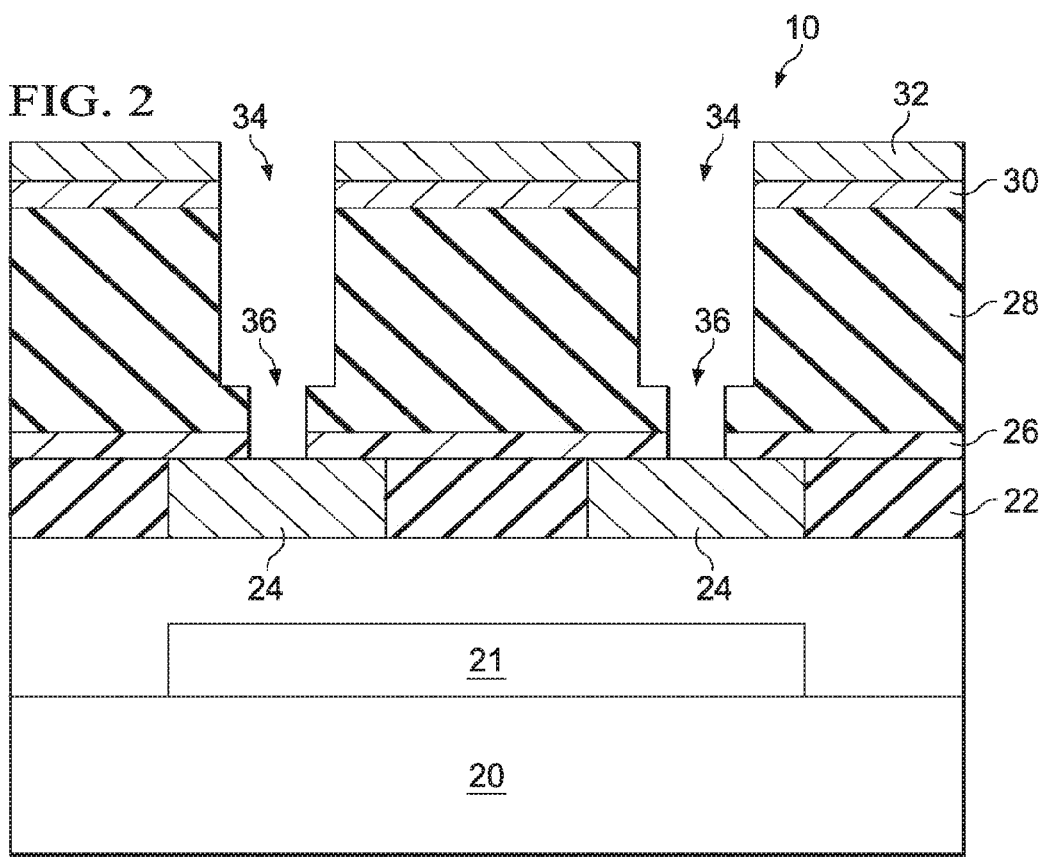

Referring to FIG. 2, trenches 34 and via openings 36 are formed in low-k dielectric layer 28. Etch stop layer 26 is also etched through. After the formation of trenches 34 and via openings 36, metal features 24 may be exposed through trenches 34 and via openings 36. The patterned metal hard mask 32 and BARC 30 may be left on the surface of wafer 10.

Figure 3A:
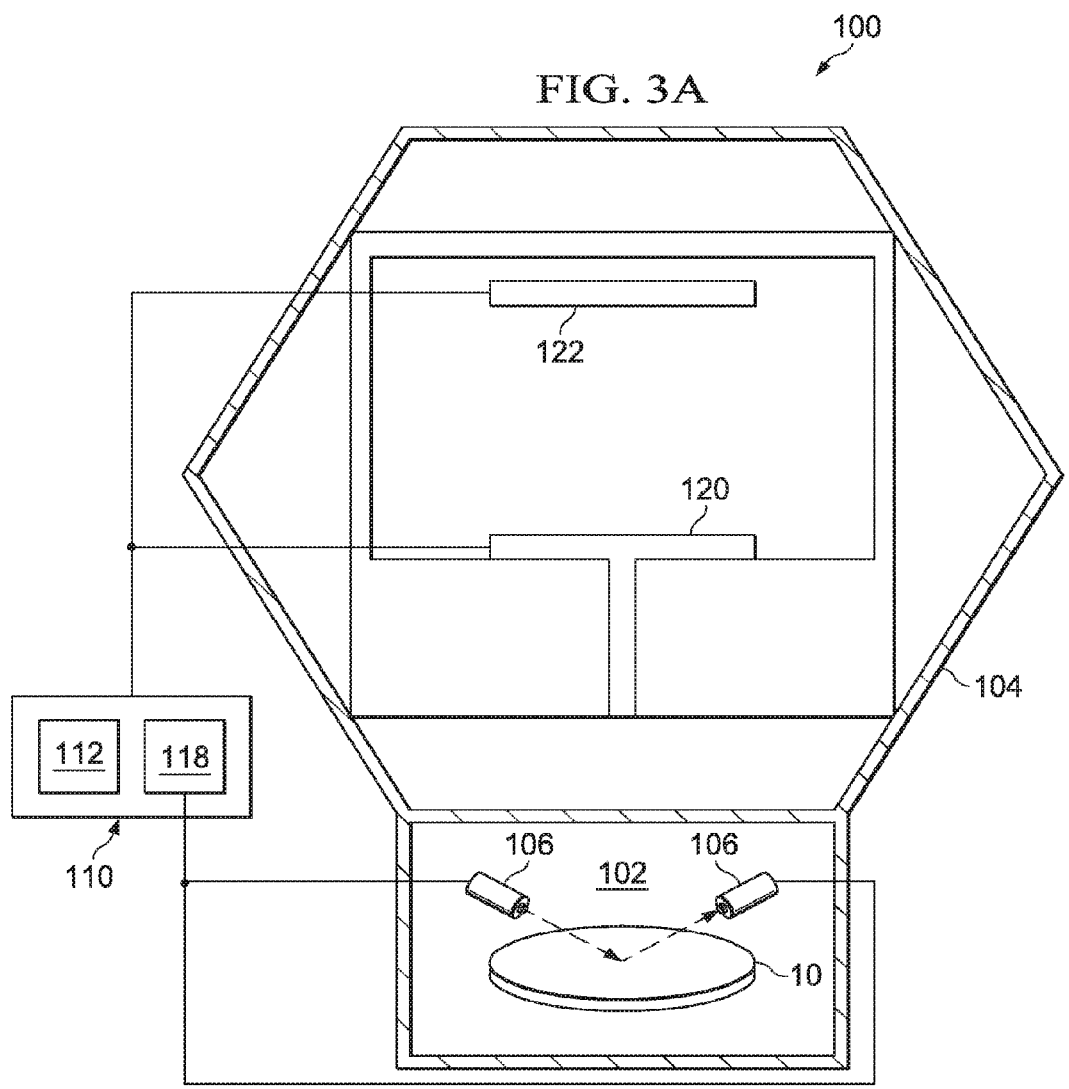
FIGS. 3A and 3B illustrate a baking process in accordance with alternative embodiments, wherein an amount of a detrimental substance in a wafer is monitored before the wafer is baked.

Next, dielectric layer 28 is baked, which is achieved by baking the respective wafer 10 as shown in FIG. 2. FIG. 3A illustrates an exemplary production tool 100 for baking wafer 10. Production tool 100 includes loadlock 102 for loading and/or unloading wafer 10, and chamber 104 for baking wafer 10. Loadlock 102 and chamber 104 may share a same vacuum environment. Wafer 10 is loaded into chamber 104 through loadlock 102. Within loadlock 102 resides apparatus 106 for monitoring the composition and the amount of detrimental substances in low-k dielectric layer 28. In an embodiment, apparatus 106 comprises a sensor of Fourier Transform infrared (FT-IR) spectrometer (including sensor 106 and body 118), which is capable of sensing the detrimental substances in low-k dielectric layer 28. Sensor 106 may collect the signals, and transmit the signals to body 118 of the respective FT-IR spectrometer, which may be located outside of production tool 100. Body 118 is capable of analyzing the signals and determining the composition and the amount of the detrimental substances. In alternative embodiments, sensor 106 and body 118 are both located in loadlock 102. The detrimental substances that are sensed by the FT-IR spectrometer include moisture, carbon and fluorine containing chemicals (carbide and/or fluoride, which may have C—F bonds, C—C bonds, and/or C—H bonds), carbon and nitrogen containing chemicals (which may have C—N bonds and/or N—O bonds), and/or the like.

In an embodiment, when wafer 10 is loaded into loadlock 102 of production tool 100, a measurement is performed by FR-IR spectrometer 118/106 to determine the amount of the detrimental substances, and the measurement results are processed by processing unit 110. Processing unit 110, in response to the measurement results, calculates optimum baking conditions, which includes baking time, power, temperature, or the like. In an embodiment, processing unit calculates through a simulation model 112, which may be pre-constructed before the baking process. The simulation model 112 may use the amount of each of the detrimental substances as an input. For example, if there are more substances (for example, substances comprising —OH bonds and/or Si—OH bonds) that are bonded tightly with the low-k material of low-k dielectric layer 28, a higher power may be used to break the bonds. On the other hand, if there is more moisture, a lower temperature and a longer baking time may be used in the baking process. The simulation model 112 may be constructed by etching sample low-k dielectric layers on a plurality of sample wafers, measuring the amount of the detrimental substances, and performing a plurality of baking processes using different baking conditions, so that the optimum simulation model 112 may be established.

Figure 3B:
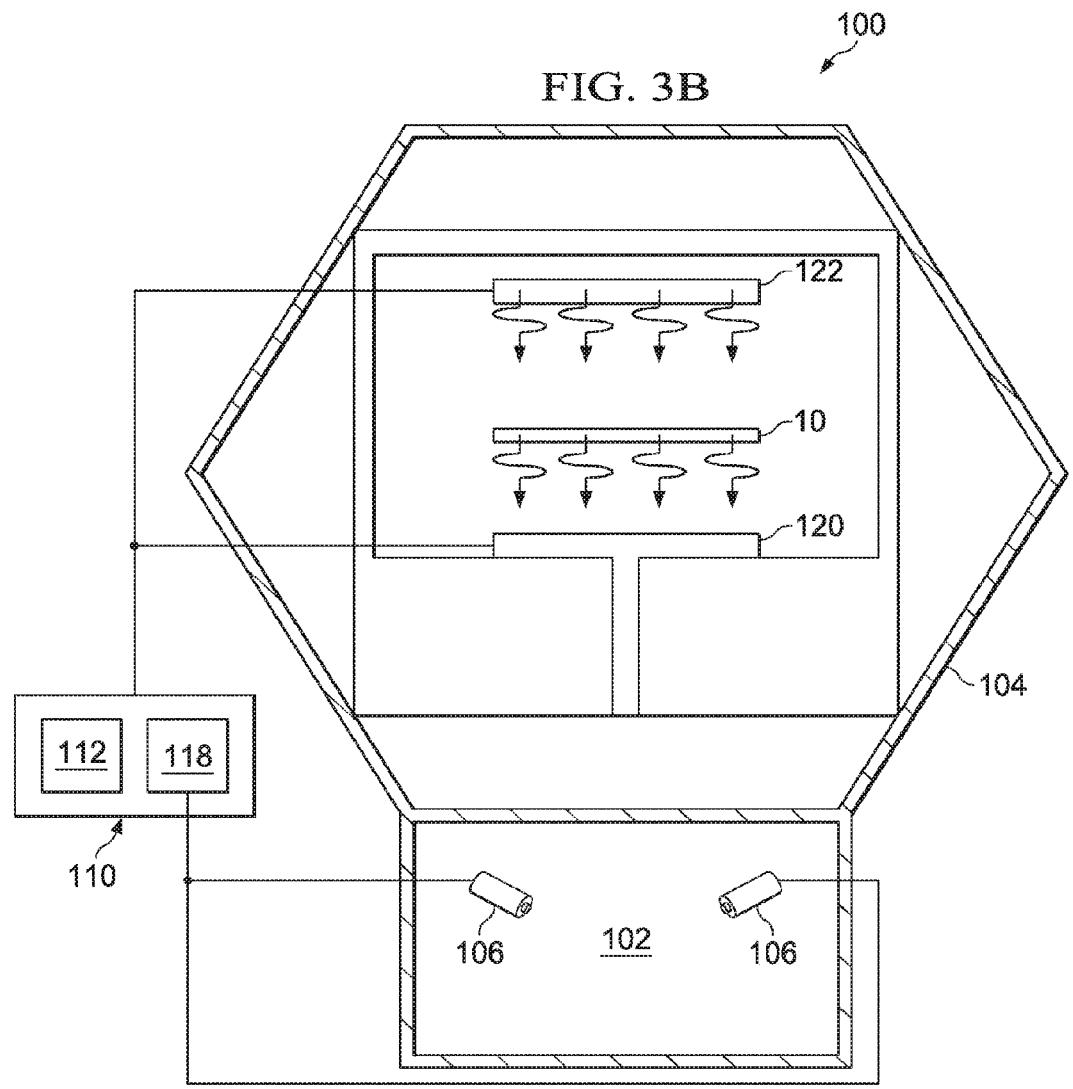

Referring to FIG. 3B, after the measurement, wafer 10 is loaded into chamber 104 and baked. In an exemplary embodiment, the baking is performed using either one, or both, of heater 120 and lamp 122. During the baking process, chamber 104 may be vacuumed. Heater 120 may provide a uniform temperature, while lamp 122 may provide light, which may be UV light, so that the tight bonds between the detrimental substances and low-k dielectric layer 28 (FIG. 2) may be broken. Heater 120 and lamp 122 may be electrically coupled to, and are controlled by, the signals of processing unit 110, which controls the baking process using the calculated optimized baking conditions including the optimum baking time, the optimum temperature, the optimum power, and the like. Accordingly, the baking process may be optimized without the occurrence of the over-baking or under-baking. In an embodiment, during the baking process, no further measurement steps are performed to measure the amount of the detrimental substances.

Figure 4:
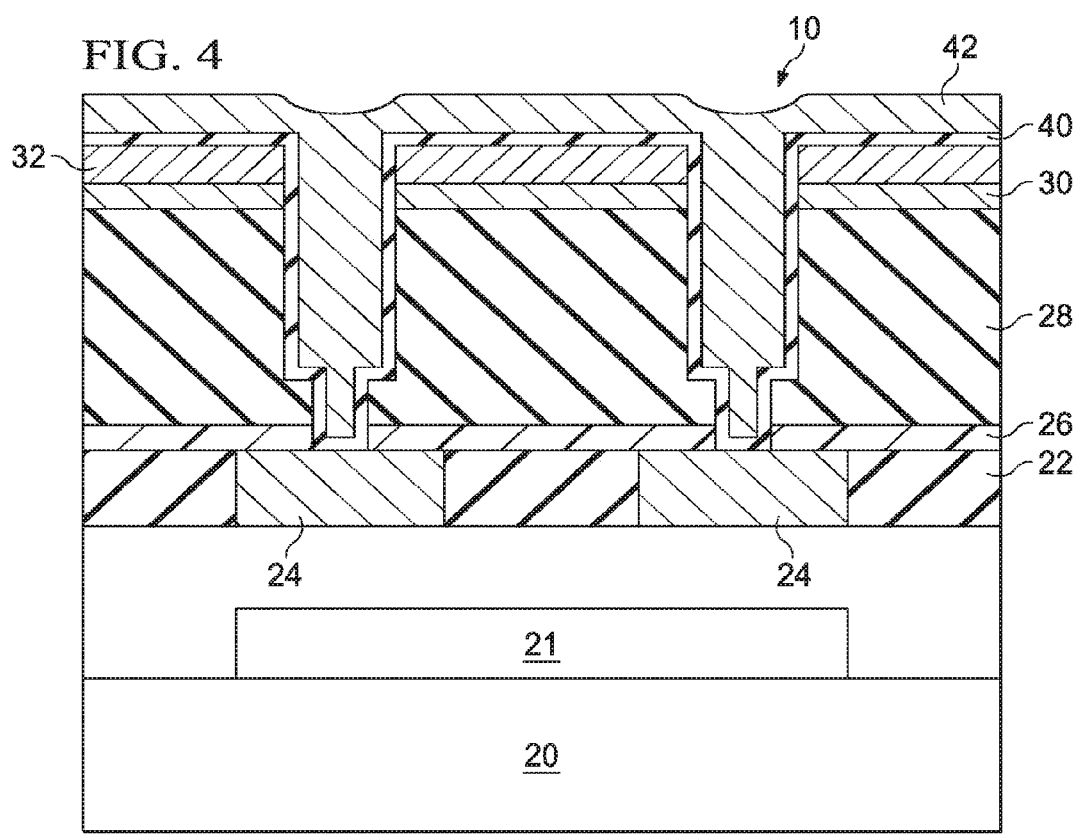

Referring to FIG. 4, diffusion barrier layer 40 and metallic material 42 are filled into trenches 34 and via openings 36 (please refer to FIG. 2). Diffusion barrier layer 40 may be formed of TaN, TiN, Ta, Ti, or the like. Metallic material 42 may be formed of copper or copper alloys. Metallic material 42 may be deposited to a level higher than the top surface of metal hard mask 32.

Figure 5:
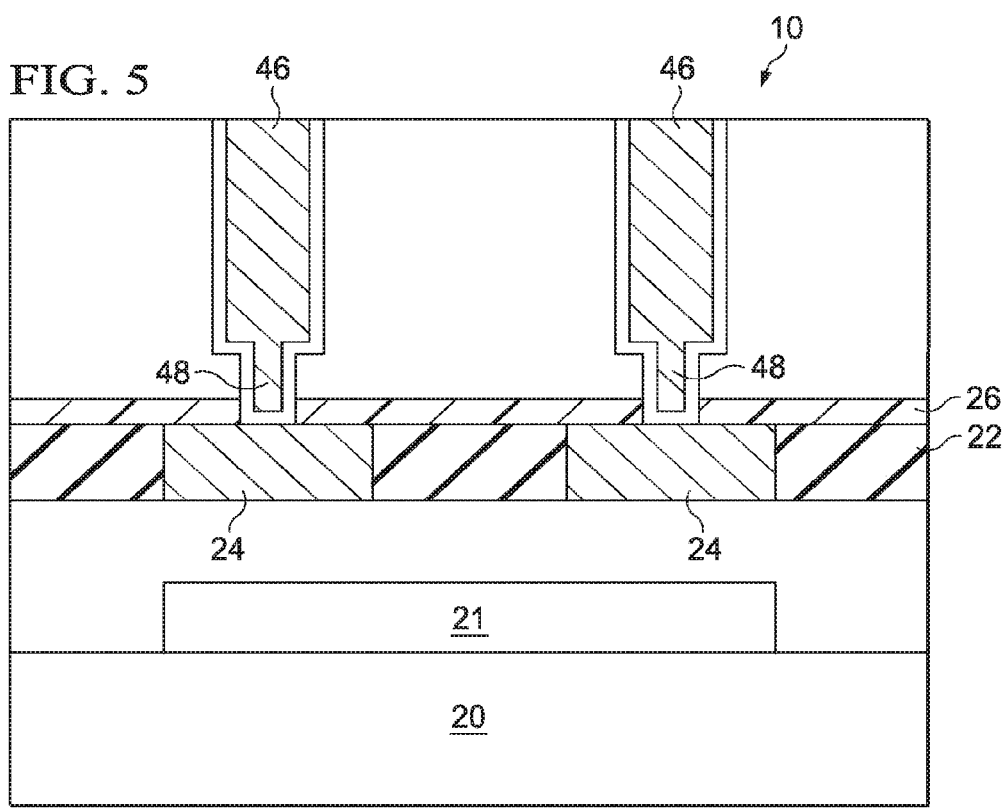

Next, as shown in FIG. 5, a planarization, such as a chemical mechanical polish (CMP) is performed to remove excess metallic material 42 and excess portions of diffusion barrier layer 40. BARC 30 and metal hard mask 32 may also be removed, for example, in the CMP. In the resulting structure, the portions of diffusion barrier layer 40 and metallic material 42 remaining in trenches 34 and via openings 36 form metal lines 46 and vias 48, respectively.

Figure 6:
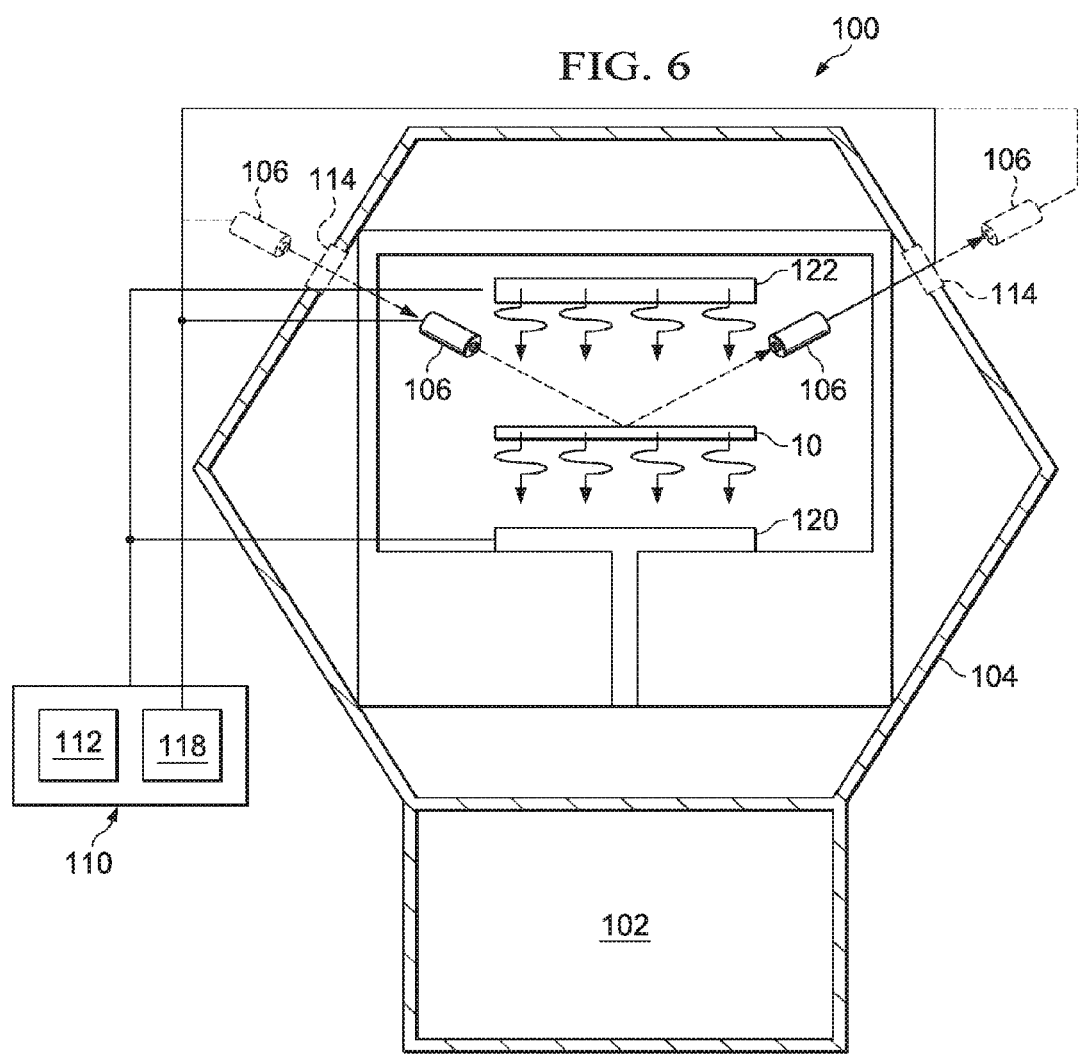
FIG. 6 illustrates a baking process in accordance with alternative embodiments, wherein an amount of detrimental substance in a wafer is monitored when the wafer is baked.

FIG. 6 illustrates production tool 100 in accordance with alternative embodiments. Unless specified otherwise, the reference numerals in these embodiments represent like elements in the embodiments illustrated in FIGS. 3A and 3B. The initial steps of this embodiment are essentially the same as shown in FIGS. 1 and 2. Next, referring to FIG. 6, the baking process is performed using production tool 100. In an embodiment, sensor 106 of the FT-IR spectrometer is located in chamber 104, while body 118 of the FT-IR spectrometer is located outside production tool 100. In alternative embodiments, sensor 106 is also located outside chamber 104, and senses wafer 10 through glass window(s) 114 of chamber 104. The signals sensed by sensor 106 are provided to processing unit 110, which may include FT-IR spectrometer body 118, so that the amount of the detrimental substances is determined based on the signals collected using sensor 106. The monitoring of the detrimental substances may be performed periodically, for example, in an interval shorter than about 30 seconds, or shorter than about 5 seconds. When a the measured amounts of the detrimental substances reach pre-determined threshold values, for example, the amounts of at least one, and possibly all, of the detrimental substances are lower than the respective pre-determined threshold amounts, processing unit 110 stops the baking process, and wafer 10 may be unloaded from production tool 100. In these embodiments, the baking time, which is part of the process conditions, is determined based on the amount of the measured detrimental substances. Furthermore, with the amounts of all detrimental substances monitored periodically, the effect and the progress of the baking process are known, and the baking process conditions may be adjusted dynamically. For example, if the removal of the detrimental substances that require higher energies is slower than expected, then the energy provided to lamp 122 may be increased, and the power provided to heater 120 is reduced. Next, the process steps as shown in FIGS. 4 and 5 may be performed to form metal lines 46 and vias 48.

It is appreciated that although in the illustrated embodiments, the amounts of the detrimental substances are measured when metal hard mask 32 is formed on the respective low-k dielectric layer 28, the embodiments may be applied when different materials other than the metal hard mask are formed on low-k dielectric layer 28, or performed when no metal hard mask is formed on low-k dielectric layer 28.

By using the embodiments, the baking process may be optimized. Therefore, after the baking process, the detrimental substances may be removed while substantially no over-baking or under-baking occurs. The reliability of the resulting integrated circuits is thus improved. Furthermore, with the baking time being controlled well, the throughput of the back-end-of-process is also increased.

In accordance with embodiments, a method includes etching a low-k dielectric layer on a wafer to form an opening in the low-k dielectric layer. An amount of a detrimental substance in the wafer is measured to obtain a measurement result. Process conditions for baking the wafer are determined in response to the measurement result. The wafer is baked using the determined process conditions.

In accordance with other embodiments, a method includes etching a low-k dielectric layer on a wafer to form an opening in the low-k dielectric layer, and measuring an amount of a detrimental substance in the wafer to obtain a measurement result. The step of measuring the amount of the detrimental substance includes measuring an amount of moisture. Process conditions for baking the wafer are determined in response to the measurement result. After the step of determining process conditions, the wafer is transferred into a chamber. The wafer is baked in the chamber using the process conditions to remove the detrimental substance from the low-k dielectric layer.

In accordance with yet other embodiments, a method includes etching a low-k dielectric layer on a wafer to form an opening in the low-k dielectric layer, and baking the wafer in the chamber using the process conditions to remove a detrimental substance. During the step of baking the wafer, an amount of the detrimental substance in the wafer is periodically measured to obtain a measurement result. The measured detrimental substance includes moisture. The step of baking the wafer is stopped in response to a measurement result indicating that the amount of the detrimental substance is lower than a pre-determined threshold value.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    etching a low-k dielectric layer on a wafer to form an opening in the low-k dielectric layer;
    determining process conditions for baking the wafer, wherein the determining the process conditions comprises providing the measurement result as an input of a simulation model;
    baking the wafer in a chamber to remove a detrimental substance using the process conditions;
    during the baking the wafer, measuring an amount of the detrimental substance in the wafer to obtain a measurement result; and
    stopping the baking the wafer in response to a measurement result indicating that the amount of the detrimental substance is lower than a pre-determined threshold value.

2. The method of claim 1, wherein the baking the wafer is performed using a lamp and a heater, and the method further comprises:
    determining a removal rate of the detrimental substance from the measurement result; and
    comparing the removal rate with an expected removal rate, and in response to the removal rate being lower than the expected removal rate, increasing an energy provided to the lamp, and reducing an energy provided to the heater.

3. The method of claim 1, wherein the amount of the detrimental substance is measured using a Fourier Transform Infrared (FT-IR) spectrometer.

4. The method of claim 1, wherein the measuring the amount of the detrimental substance and the baking the wafer are performed in a same chamber.

5. The method of claim 1, wherein at a time the wafer is baked, the wafer comprises a hard mask over the low-k dielectric layer, and the method further comprises:
    after the baking the wafer, forming a diffusion barrier layer in the opening;
    filling a remaining portion of the opening with a copper-containing material, wherein the copper-containing material is over the diffusion barrier layer; and
    performing a planarization to remove excess portions of the copper-containing material.

6. The method of claim 1, wherein the amount of the detrimental substance in the wafer is measured through a window of the chamber.

7. A method comprising:
    baking a wafer;
    during the baking the wafer, measuring compositions of detrimental substances in the wafer;
    adjusting process conditions for baking the wafer in response to the measured compositions; and
    baking the wafer using the adjusted process conditions, wherein the baking the wafer is performed using a lamp and a heater, and the method further comprises:
    determining a removal rate of the detrimental substances from the measured amounts of the detrimental substances; and
    comparing the removal rate with an expected removal rate, and in response to the removal rate being lower than the expected removal rate, increasing an energy provided to the lamp, and reducing an energy provided to the heater; and
    measuring amounts of the detrimental substances to determine a stopping point of the baking.

8. The method of claim 7, wherein the amounts of the detrimental substances are measured using a sensor located in a same chamber for baking the wafer.

9. The method of claim 7, wherein the amounts of the detrimental substances are measured using a sensor located outside of a chamber for baking the wafer, and the measuring is performed through a window of the chamber.

10. The method of claim 7, wherein the adjusting the process conditions comprises adjusting a power provided to a lamp used for baking the wafer.

11. The method of claim 7, wherein the adjusting the process conditions comprises adjusting a power provided to a heater used for baking the wafer.

12. A method comprising:
    baking a wafer using a lamp and a heater;
    during the baking the wafer, measuring compositions and amounts of detrimental substances in the wafer periodically;
    adjusting a first power provided to the lamp and a second power provided to the heater in response to the measured compositions and the measured amounts; and
    baking the wafer using the adjusted first power and the adjusted second power.

13. The method of claim 12, wherein the adjusting the first power and the second power comprises increasing a first one of the first power and the second power, and decreasing a second one of the first power and the second power.

14. The method of claim 13, wherein the adjusting the first power and the second power comprises increasing the first power and reducing the second power.

15. The method of claim 13 further comprising, in response to the amounts of the detrimental substances being lower than pre-determined threshold values, stopping the baking.

16. The method of claim 13, wherein the measuring the amounts of the detrimental substances is performed using a sensor located in a chamber for baking the wafer.

17. The method of claim 13, wherein the measuring the amounts of the detrimental substances is performed using a sensor located outside of a chamber for baking the wafer, and the measuring is performed through a window of the chamber.

18. The method of claim 7, wherein the stopping point of the baking is reached when the amounts of the detrimental substances are lower than pre-determined threshold values.

19. The method of claim 18 further comprising stopping the baking when the stopping point of the baking is reached.

20. The method of claim 1, wherein the amounts of the detrimental substances are measured using a Fourier Transform Infrared (FT-IR) spectrometer.

* * * * *